US008585910B2

(12) United States Patent
Sparks et al.

(10) Patent No.: US 8,585,910 B2
(45) Date of Patent: Nov. 19, 2013

(54) PROCESS OF MAKING A MICROTUBE AND MICROFLUIDIC DEVICES FORMED THEREWITH

(75) Inventors: Douglas Ray Sparks, Whitmore Lake, MI (US); Nader Najafi, Ann Arbor, MI (US)

(73) Assignee: Integrated Sensing Systems Inc., Ypsilanti, MI (US)

( * ) Notice: Subject to any disclaimer, the term of this patent is extended or adjusted under 35 U.S.C. 154(b) by 1203 days.

(21) Appl. No.: 12/397,197

(22) Filed: Mar. 3, 2009

(65) Prior Publication Data

US 2009/0220710 A1 Sep. 3, 2009

Related U.S. Application Data

(60) Provisional application No. 61/067,882, filed on Mar. 3, 2008.

(51) Int. Cl.
*G01F 1/84* (2006.01)
*G01F 1/76* (2006.01)
*B81C 1/00* (2006.01)
*B01L 3/00* (2006.01)

(52) U.S. Cl.
CPC ............ *B81C 1/00* (2013.01); *B81C 1/00357* (2013.01); *B81C 1/0019* (2013.01); *B81C 1/00468* (2013.01); *B81B 2203/0338* (2013.01); *B81B 2203/0323* (2013.01); *G01F 1/84* (2013.01); *G01F 1/8404* (2013.01); *G01F 1/8409* (2013.01); *G01F 1/844* (2013.01); *G01F 1/8445* (2013.01); *B01L 3/5027* (2013.01)
USPC ........ 216/2; 216/33; 216/36; 216/27; 216/56; 216/58; 216/97; 216/79; 216/96; 216/99; 438/456; 438/455; 438/700; 438/706; 438/710; 438/719; 438/745; 438/753; 73/861.354; 73/861.355

(58) Field of Classification Search
CPC .. B81C 1/00; B81C 1/00357; B81C 1/00119; B81C 1/00468; B81B 2203/0038; B81B 2203/00323; G01F 1/84; G01F 1/8404; G01F 1/8409; G01F 1/844; G01F 1/8445; B01L 3/5027
USPC ............. 216/58, 67, 79, 96, 99, 2, 27, 33, 56, 216/36; 438/456, 455, 700, 706, 710, 719, 438/745, 753; 73/861.354, 861.355
See application file for complete search history.

(56) References Cited

U.S. PATENT DOCUMENTS 4,966,646 A * 10/1990 Zdeblick ...................... 216/2
6,477,901 B1 * 11/2002 Tadigadapa et al. ..... 73/861.352
(Continued)

FOREIGN PATENT DOCUMENTS

GB          2221302         1/1990

OTHER PUBLICATIONS

Tjerkstra et al., "Etching Technology for Chromatagraphy Microchannels", Electrochimica Acta, vol. 43, Nos. 20-22, pp. 3399-3406, 1997.*
(Continued)

*Primary Examiner* — Lan Vinh
*Assistant Examiner* — David Kaufman
(74) *Attorney, Agent, or Firm* — Hartman Global IP Law; Gary M. Hartman; Domenica N. S. Hartman

(57) ABSTRACT

A process for producing a micromachined tube (microtube) suitable for microfluidic devices. The process entails isotropically etching a surface of a first substrate to define therein a channel having an arcuate cross-sectional profile, and forming a substrate structure by bonding the first substrate to a second substrate so that the second substrate overlies and encloses the channel to define a passage having a cross-sectional profile of which at least half is arcuate. The substrate structure can optionally then be thinned to define a microtube and walls thereof that surround the passage.

15 Claims, 5 Drawing Sheets

(56) References Cited

U.S. PATENT DOCUMENTS

| | | | |
|---|---|---|---|
| 6,647,778 B2 | 11/2003 | Sparks | |
| 7,351,603 B2 | 4/2008 | Sparks et al. | |
| 7,381,628 B2 | 6/2008 | Sparks et al. | |
| 2002/0174686 A1* | 11/2002 | Krulevitch et al. | 65/41 |
| 2003/0061889 A1* | 4/2003 | Tadigadapa et al. | 73/861.355 |
| 2006/0037187 A1* | 2/2006 | Sparks et al. | 29/592.1 |

OTHER PUBLICATIONS

Peter Enoksson, Goran Stemme and Erik Stemme; A Coriolis Mass Flow Sensor Structure in Silicon; Royal Institute of Technology; Sweden; 0-7803-2985-6/96.

Peter Enoksson, Goran Stemme and Erik Stemme; Fluid density sensor based on resonance vibration; Royal Institute of Technology, Sweden; SSDI 0924-4247 (94) 00915-5.

Peter Enoksson, Goran Stemme, and Erik Stemme; A Silicon Resonant Sensor Structure for Coriolis Mass-Flow Measurements; Journal of Microelectromechanical Systems, vol. 6, No. 2, Jun. 1997.

Peter Enoksson, Goran Stemme, and Erik Stemme; Vibration Modes of a Resonant Silicon Tube Density Sensor; Journal of Microelectromechanical Systems, vol. 5, No. 1, Mar. 1996.

Tjerkstra, R. W. et al. Etching technology for chromatography microchannels. Electrochimica Acta. 42 (20-22), 1997, pp. 3399-3406.

Sparks, D. and Hubbard. T. Micromachined needles and lancets with design adjustable bevel angles. J. Micromechanics and Microengineering 14, Jun. 2004, pp. 1230-1233.

Sparks, D. et al. The resonant behavior of silicon tubes under two-phase microfluidic conditions with both microbeads and gas bubbles. Sensors and Actuators A 135, Sep. 2006, pp. 827-832.

Noh, H. Parlene micromolding, a rapid and low-cost fabrication method for pharylene microchannel. Sensors and Actuators B 102, 2004, pp. 78-85.

Stemme, G. 'Micro Fluid Sensors and Actuators.' In: Sixth International Symposium on Micro Machine and Human Science. 1995 IEEE, pp. 45-52.

* cited by examiner

PROCESS OF MAKING A MICROTUBE AND MICROFLUIDIC DEVICES FORMED THEREWITH

CROSS REFERENCE TO RELATED APPLICATIONS

This application claims the benefit of U.S. Provisional Application No. 61/067,882, filed Mar. 3, 2008, the contents of which are incorporated herein by reference.

BACKGROUND OF THE INVENTION

The present invention generally relates to micromachining processes and devices formed thereby. More particularly, this invention relates to a process of forming a micromachined tube (microtube) suitable for a microfluidic device, including but not limited to Coriolis mass flow sensors, density sensors, specific gravity sensors, fuel cell concentration meters, chemical concentration sensors, temperature sensors, drug infusion devices, fluid delivery devices, gas delivery devices, gas sensors, bio sensors, medical sensors, and other devices capable of making use of a stationary or resonating microtube.

Processes for fabricating resonant mass flow and density sensors using silicon micromachining techniques are disclosed in commonly-assigned U.S. Pat. Nos. 6,477,901, 6,647,778, 7,351,603 and 7,381,628. As used herein, micromachining is a technique for forming very small elements by bulk etching a substrate (e.g., a silicon wafer), and/or by surface thin-film etching, the latter of which generally involves depositing a thin film (e.g., polysilicon or metal) on a sacrificial layer (e.g., oxide layer) on a substrate surface and then selectively removing portions of the sacrificial layer to free the deposited thin film. In the processes disclosed in U.S. Pat. Nos. 6,477,901, 6,647,778, 7,351,603 and 7,381,628, wafer bonding and etching techniques are used to produce a micromachined tube supported above a surface of a substrate. The tube can be vibrated at resonance, by which the flow rate, density, and/or other properties or parameters of a fluid flowing through the tube can be measured.

According to one embodiment of U.S. Pat. No. 6,477,901, a tube is formed using p-type doped layers and selective etching techniques. The doped layers form the walls of the tube, and therefore determine and limit the size of the tube walls as well as the cross-sectional dimensions of the tube. According to another embodiment of U.S. Pat. No. 6,477,901, a tube is formed with the use of a silicon-on-insulator (SOI) wafer. The buried oxide layer of the SOI wafer is used as an etch stop in a manner that determines and can limit the thickness of the tube. In U.S. Pat. No. 7,351,603, an epitaxial wafer is employed to avoid the higher cost of SOI wafers.

The micromachined tubes produced by the processes disclosed in U.S. Pat. Nos. 6,477,901, 6,647,778, 7,351,603 and 7,381,628 have roughly rectilinear cross-section passages as a result of using an anisotropic dry etching technique, such as reactive ion etching (RIE), dry etching, or deep reactive ion etching (DRIE), or a wet etching technique if the wafer is formed of a (110) oriented silicon. As known in the art, anisotropic etching processes produce a substantially one-directional etch, yielding the vertical walls of the passages shown within the microtubes of U.S. Pat. Nos. 6,477,901, 6,647,778, 7,351,603 and 7,381,628.

BRIEF SUMMARY OF THE INVENTION

The present invention provides a process for producing a micromachined tube suitable for microfluidic devices, nonlimiting examples of which include resonating microtubes for mass flow and density sensors, stationary microtubes, diaphragms, and passages for such microfluidic devices as needles, cannula, pressure sensors, temperature sensors, motion sensors, drug infusion devices, fluid delivery devices, gas delivery devices, gas sensors, bio sensors, medical sensors, and other devices that can employ microtubes.

According to a first aspect of the invention, the process entails isotropically etching a surface of a first substrate to define therein a channel having an arcuate cross-sectional profile, and forming a substrate structure by bonding the first substrate to a second substrate so that the second substrate overlies and encloses the channel to define a passage having a cross-sectional profile of which at least half is arcuate. The substrate structure can optionally then be thinned to define a microtube and walls thereof that surround the passage.

A second aspect of the invention is the various types of microtubes produced by the process described above.

In view of the above, the present invention provides a process by which microtubes with at least partially arcuate passages can be micromachined. According to preferred aspects of the invention, a channel can be formed in the second substrate to have an arcuate cross-sectional profile, with the result that the passage has an entirely arcuate cross-sectional profile, nonlimiting examples of which include circular and elliptical cross-sectional shapes. Arcuate passages produced by this invention are capable of exhibiting improved dynamic fluid flow as a result of reduced turbulence and stagnant regions within these passages, resulting in lower pressure drops and higher flow rates through their microtubes without necessitating an increase in the in-plane (width) and out-of-plane (height) dimensions of the microtubes.

Other aspects and advantages of this invention will be better appreciated from the following detailed description.

DETAILED DESCRIPTION OF THE INVENTION

FIGS. 1 through 10 represent steps in a process carried out to produce a micromachined tube (microtube) 50 (FIGS. 9 and 10) suitable for a variety of microfluidic devices. The drawings are drawn for purposes of clarity when viewed in combination with the following description, and therefore are not necessarily to scale.

Figure 1:
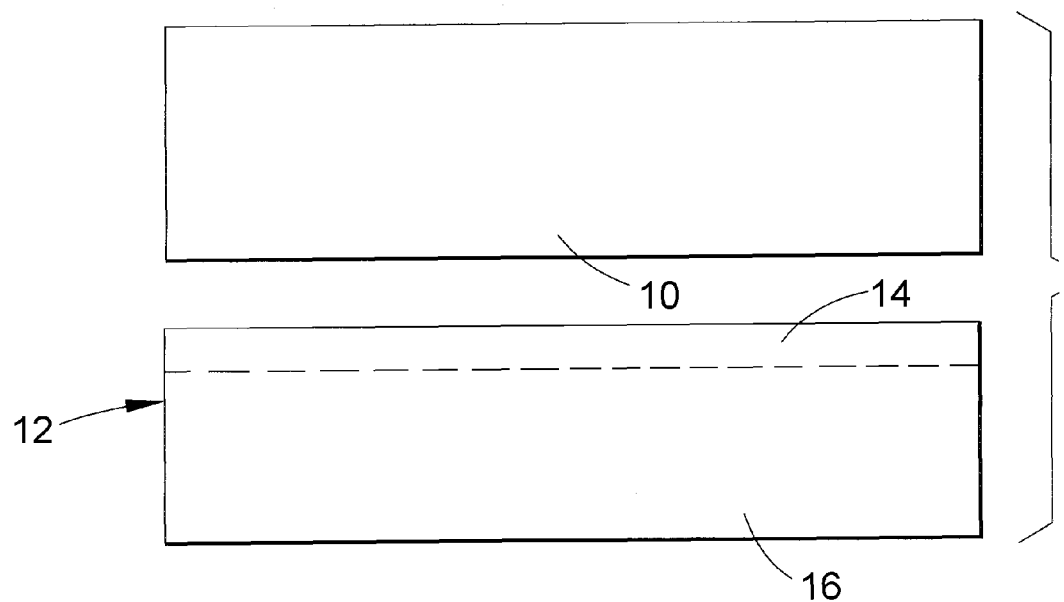
FIG. 1 shows cross-sectional views of two wafers suitable as starting material for producing a micromachined tube in accordance with an embodiment of this invention.

FIG. 1 depicts limited portions of a pair of wafers 10 and 12 selected for processing in accordance with the invention. The wafers 10 and 12 are both preferably silicon, though other materials can be used including but not limited to Ge, SiC, GaAs, Si/Ge, diamond, sapphire, glass, ceramic materials, plastic materials, and titanium or other metallic materials. In addition, the wafers 10 and 12 can be single crystal or polycrystalline. According to one embodiment of the invention, the wafers 10 and 12 may be undoped, though in a preferred embodiment both wafers 10 and 12 are doped similar in type and level. The type (n or p-type) and doping level can be tailored as may be required or desired by one skilled in the art. Suitable doping levels for the wafers 10 and 12 generally achieve resistivities of about 1 to about 0.01 ohm-cm, with the exception of an etchstop region 14 overlying a substrate region 16 of the wafer 12. The etchstop region 14 can be an oxide layer or a heavily doped epitaxial or diffused layer using known dopants and doping techniques, such as p-type doping with boron, boron-germanium, etc. While shown as a surface region, the etchstop region 14 could instead be formed as a buried layer of the wafer 12. The role of the region 14 as an etchstop will become apparent from the following discussion, though it will also become apparent that the region 14 could be replaced by various other materials capable of serving as an etchstop. To obtain a desired configuration and thickness, the wafers 10 and 12 can undergo various processes, including wet chemical etching (selective, timed, etc.), dry etching (e.g., ion milling, plasma enhanced etching, reactive ion etching (RIE), deep reactive ion etching (DRIE), mechanical removal (grinding, polishing, etc.), chemical-mechanical polishing (CMP), etc. The thickness of the wafer 10 will subsequently limit the maximum height dimension of the microtube 50 (as measured in a direction normal to the wafer surface) of FIGS. 9 and 10. For microtubes of particular interest to the invention, the thickness of the wafer 10 is preferably in a range of about 100 to about 1500 micrometers, though lesser and greater thicknesses are also within the scope of this invention.

Figure 2:
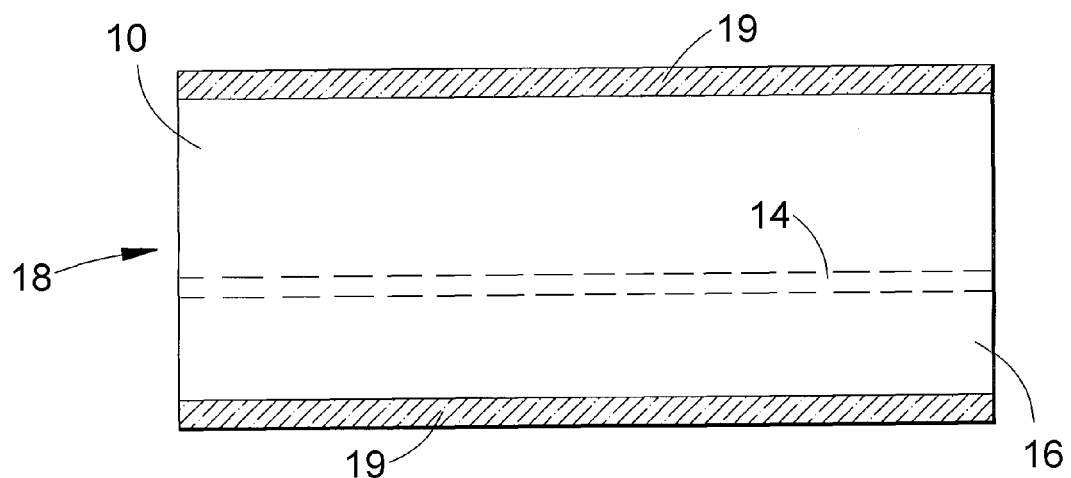
FIG. 2 shows the wafers of FIG. 1 bonded together to form a wafer stack.

FIG. 2 shows the result of cleaning and then bonding the wafer 10 to the etchstop region 14 of the wafer 12 to form a wafer stack 18, resulting in the etchstop region 14 effectively becoming a buried layer within the wafer stack 18. Bonding can be accomplished by a variety of techniques, such as fusion, direct, anodic, solder, eutectic, and adhesive bonding. Silicon fusion bonding is the preferred method if the wafers 10 and 12 are formed of silicon, as this technique can be performed at room temperature under vacuum or at ambient pressures with a plasma-assist bonding mechanism. As the intent of the bonding step is in part to bury the etchstop region 14, it is foreseeable that a wafer with a buried etchstop region could be formed by various other processes that are also within the scope of the invention. Furthermore, it will become apparent from the following discussion that the etchstop region 14 could be omitted.

Figure 3:
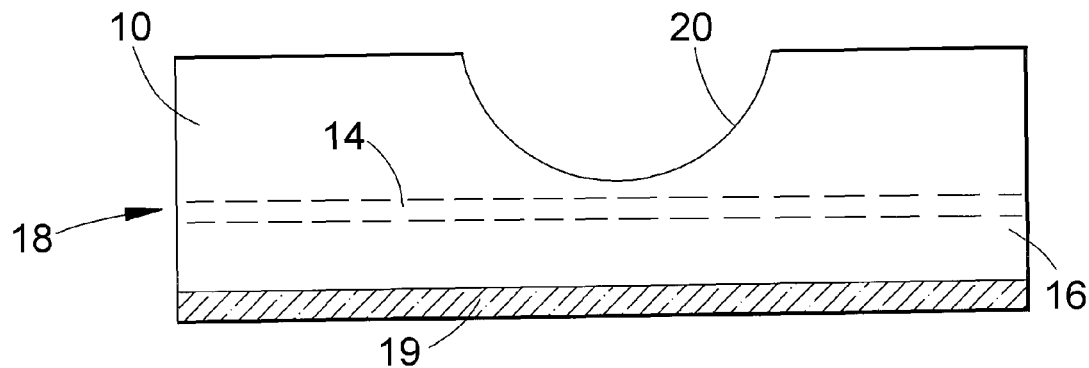
FIG. 3 depicts the wafer stack following etching to form an arcuate channel in a surface of the wafer stack.

Following bonding, a high temperature anneal/oxidation can be employed to strengthen the silicon fusion bond. FIG. 2 shows the wafer stack 18 provided with masks 19 to protect its surfaces from attack during a subsequent etching step, the result of which is shown in FIG. 3. The masks 19 can be oxide layers formed during the high temperature anneal/oxidation step, though other processes known in the art can be used to mask the wafer stack 18 with a variety of masking materials, including but not limited to silicon nitride, combined silicon oxide and silicon nitride, photoresists, polymers, metals, dielectrics, etc. FIG. 3 shows the result of etching a channel 20 in a surface of the wafer stack 18 formed by the wafer 10, for example, after removing part or all of the mask 19 overlying this surface. The channel 20 is represented as having an arcuate or curvilinear profile in cross-section. According to a preferred aspect of the invention, the etching technique used to define the channel 20 is an isotropic process, preferably a dry etching technique and more preferably a plasma etching technique using $SF_6$, $CF_4$, $Cl_2$, $XeF_2$, etc., though an isotropic wet etching technique could also be used. In each case, the isotropic etching process proceeds into the wafer 10 in all directions from the point at which etching is initiated to achieve an arcuate or curvilinear profile shape, including but not limited to the semicircular shape of the channel 20 shown in FIG. 3. As shown in FIG. 3, the etching process is preferably terminated prior to encountering the etchstop region 14.

Figure 4:
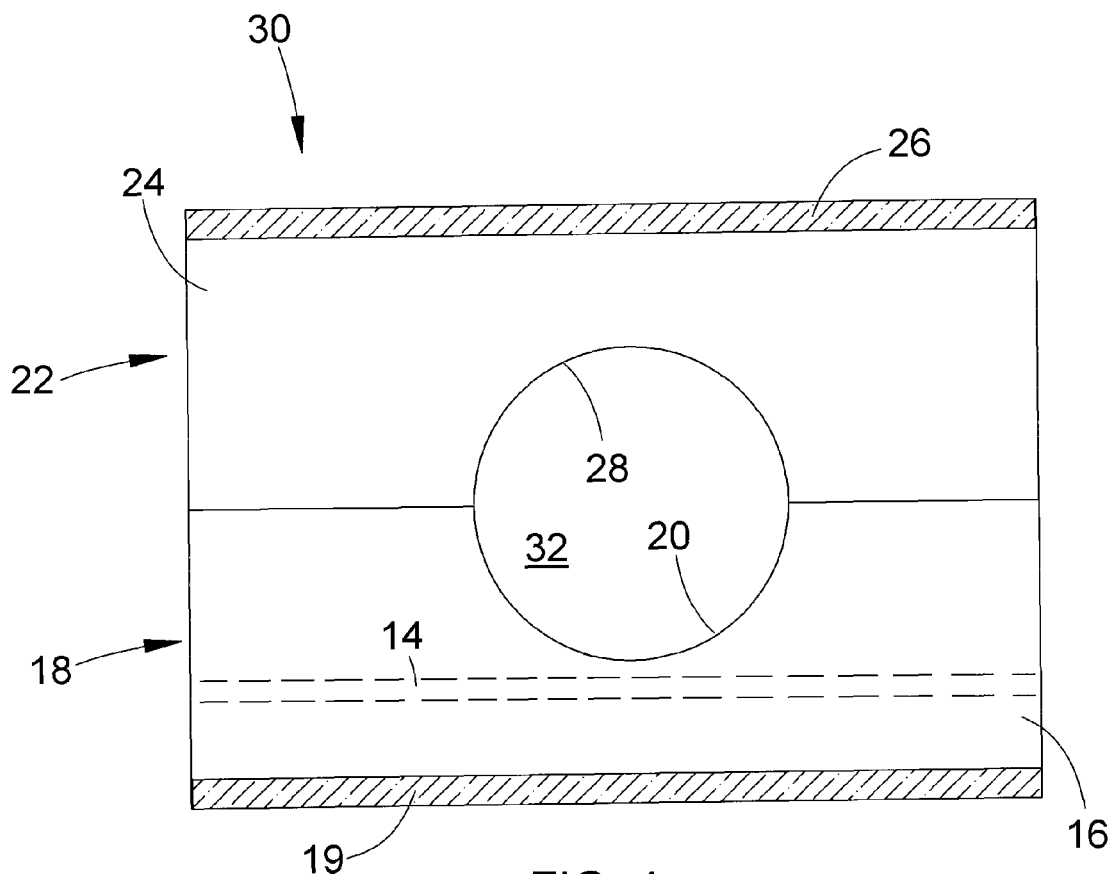
FIG. 4 depicts the result of bonding the wafer stack of FIG. 3 to a third wafer having an arcuate channel formed in its surface, with the result that an enclosed round passage is defined within the resulting wafer structure by the two arcuate channels.

In FIG. 4, the etched wafer stack 18 of FIG. 3 is shown bonded to a wafer 22 having a semicircular channel 28 defined in a substrate region 24, and a mask 26 (for example, an oxide layer) on the surface of the substrate region 24 opposite the channel 28. The wafer 22 may be a standard silicon wafer, an epitaxial wafer, or processed as a wafer stack similar to the wafer stack 18 of FIG. 3. Bonding of the wafer stack 18 and wafer 22 can be accomplished by a variety of techniques, such as fusion, direct, anodic, solder, eutectic, and adhesive bonding. Silicon fusion bonding is again a preferred method if the wafer stack 18 and wafer 22 are formed of silicon, and a high temperature anneal/oxidation can be employed to strengthen the silicon fusion bond. The wafer 22 is preferably selected on the basis of having a channel 28 of substantially equal width to the channel 20 of the wafer stack 18. The channels 20 and 28 can be matched via an alignment technique, and the wafer stack 18 and wafer 22 bonded together to produce a wafer structure 30 within which the semicircular channels 20 and 28 define a circular passage 32 within the structure 30. It should be noted that channels 20 and 28 having cross-sectional profiles that deviate from a semicircular shape will yield passages 32 that deviate from a circular shape, for example, elliptical shapes. Furthermore, it is foreseeable that the wafer stack 18 could be bonded to a flat surface of another wafer, yielding a semicircular passage. These and other cross-sectional shapes incorporating a round profile are also within the scope of this invention.

Figure 5:
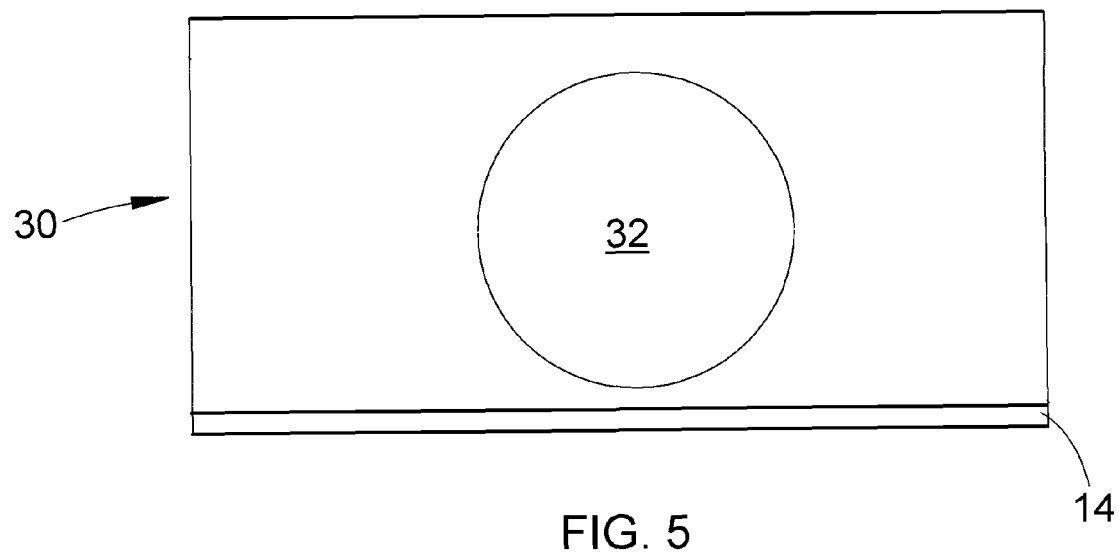
FIG. 5 depicts the result of thinning the wafer structure of FIG. 4.

FIG. 5 shows the result of thinning the wafer structure 30 by removing material at both surfaces of the structure 30. The removal process at the lower surface of the structure 30 (as viewed in FIG. 5) is represented as having been terminated at the etchstop region 14. Suitable etchants for this process will depend on the type of material used to form the etchstop region 14, for example, an oxide layer or a heavily doped p-type silicon. Those skilled in the art will appreciate that lapping, polishing, grinding, wet or dry etching, or a combination of these techniques could be used to thin the wafer structure 30, with or without the presence of the etchstop 14. In the embodiment shown in FIG. 5, the thickness of the etchstop region 14 affects the minimum lower wall thickness of the tube 50 below the passage 32. Removal of the substrate region 24 opposite the etchstop region 14 can be by lapping, polishing, grinding, wet or dry etching, or a combination of these techniques, or through the presence of a buried etchstop (not shown) originally present in the wafer 22 similar to the wafer stack 18. A timed etch or timed mechanical removal process can also be used to ensure the remaining surface region 24 defines a suitably thick wall above the passage 32.

Suitable thicknesses for the tube wall will depend on the particular application for the microtube 50, with particularly suitable thicknesses believed to be about ten to a few hundred micrometers.

Figure 6:
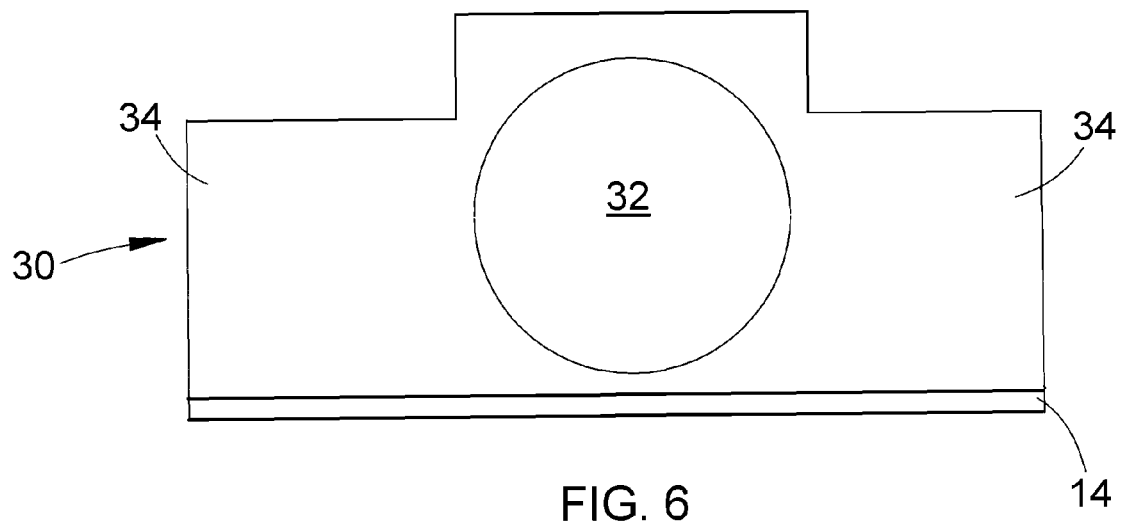
FIG. 6 depicts the result of selectively thinning portions of the wafer structure to either side of the round passage.

Following bonding of the wafer stack 18 and wafer 22 (FIG. 4) and optionally thinning the resulting wafer structure 30, the passage 32 and the surrounding structure can conceivably have a form suitable for use in a variety of microfluidic devices. According to a preferred aspect of the invention, FIGS. 6 through 10 depict further processing steps suitable for further defining a microtube 50 and a microfluidic device that utilizes the microtube 50. FIG. 6 shows the result of masking and etching the surface of the wafer structure 30 opposite the etchstop region 14 to establish what will become the lateral walls of the microtube 50. For this step, a plasma etch process and a resist mask (not shown) may be employed, though other masking materials and techniques could foreseeably be used, such as an oxide layer, combination of resist and oxide layer, etc. As evident from FIG. 6, the etching step is used to only partially etch through the thickness of the wafer structure 30. The depth of this etch is dependent on the thickness and strength of the wafer structure 10 desired for subsequent fabrication and handling. In FIG. 6, less than half the thickness of the wafer structure 30 on either side of the passage 32 has been etched, leaving side portions 34 that interconnect the passage 32 to the remainder of the wafer structure 30.

Figure 7:
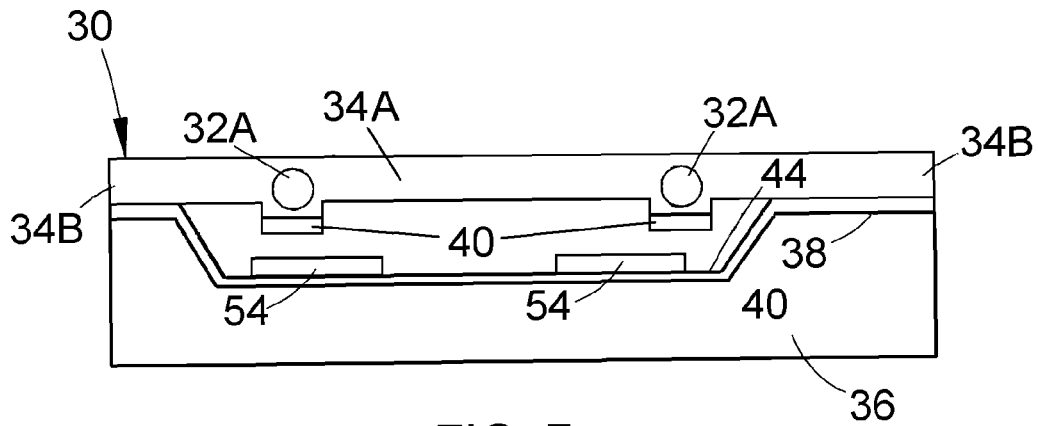
FIGS. 7 and 8 depict the wafer structure of FIG. 6 bonded to a substrate.
Figure 8:
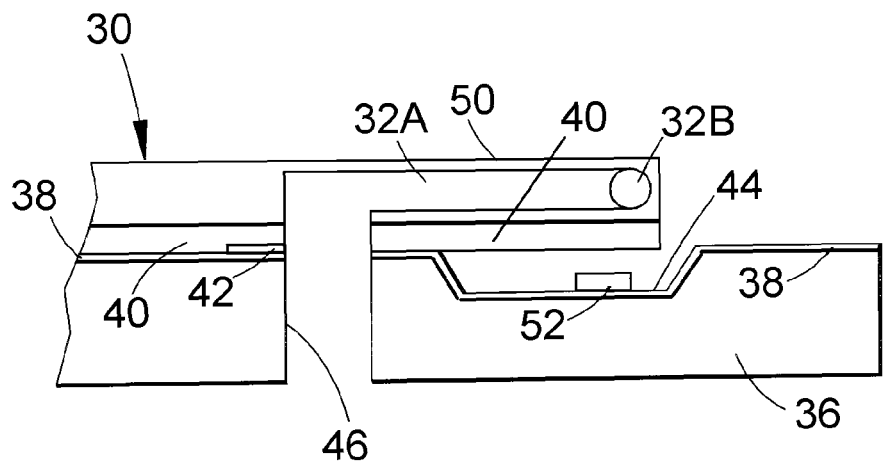

FIGS. 7 and 8 represent a particular example in which the passage 32 has been defined within the wafer structure 30 to have a U-shaped configuration (when viewed from above) comprising a pair of leg portions 32A and an interconnecting distal portion 32B. As will be discussed below, other configurations are possible and within the scope of the invention. FIGS. 7 and 8 represent cross-sections of the entire wafer structure 30 (instead of the partial sections represented in FIGS. 1 through 6) that are taken transverse to each other, with FIG. 7 being a cross-sectional view transverse to and through the leg portions 32A of the U-shaped passage 32 and FIG. 8 being a cross-sectional view parallel to the leg portions 32A and transverse to and through the distal portion 32B.

FIGS. 7 and 8 represent the wafer structure 30 after being flipped and bonded to a micromachined and metallized substrate 36, with the result that the portion of the wafer structure 30 containing the tube passage 32 is cantilevered over a recess 44 in the substrate 36. The tube wall of the wafer structure 30 that faces the substrate 36 is represented as having an electrically conductive layer 40. As evident from FIG. 8, the conductive layer 40 provides an electrical path that connects the microtube 50 and a metal contact 42 on the substrate 36, enabling electrical grounding or biasing of the microtube 50. Various conductive materials can be used as the conductive layer 40, which may or may not be electrically insulated from the remainder of the wafer structure 30. Furthermore, the wafer structure 30 may be sufficiently doped (if formed of a semiconductor material) or otherwise formed of an electrically conductive material to render the layer 40 unnecessary. The substrate 36 may be formed of a variety of materials, including Pyrex, borofloat, quartz, or other glass-type wafer, silicon, SOI, plastic, ceramic, or another material. According to a preferred aspect of the invention, the substrate 36 is a glass wafer. A variety of bonding techniques can be employed for this purpose, with anodic bonding being preferred. According to an alternative aspect of the invention, the substrate 36 is a silicon wafer on which a dielectric coating or oxide layer has been formed to provide an electrical insulating layer 38 for the metal contact 42 as well as other metallization on the substrate 36 forming electrical runners, bond pads, etc., for the microfluidic device. A variety of bonding techniques can be employed for this purpose, with fusion bonding being preferred.

In the U-shaped configuration of the passage 32 represented in FIGS. 7 and 8, a side portion 34A of the wafer structure 30 is surrounded on three sides (in the plane of the wafer structure 30) by the leg and distal portions 32A and 32B of the tube passage 32, and another side portion 34B surrounds the tube passage 32 along its outer perimeter (again, in the plane of the wafer structure 30). By removing the side portions 34A and B, the external shape of the microtube 50 will also approximate a U-shape similar to that of the tube passage 32. Inlet and outlet holes 46 (one of which is shown in FIG. 8) can be formed at this time by etching, preferably DRIE.

Figure 9:
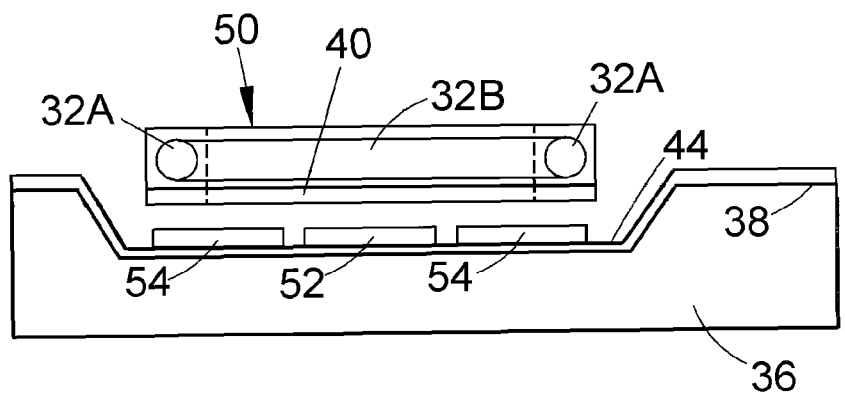
FIG. 9 depicts the result of removing remaining portions of the wafer structure of FIGS. 7 and 8 to define external walls of a microtube having a freestanding portion suspended over the substrate.

FIG. 9 shows the result of masking and etching the remainder of the wafer structure 30 to remove the side portions 34 and complete the microtube 50 and its outer periphery, including the external surfaces of the walls that surround the tube passage 32. For this process, a mask (not shown) can be aligned through the substrate 36 to the edges of the side portions 34 or to metallization or the recess 44 on the surface of the substrate 36 using double-side alignment tools or another similar technique known in the art. Alternatively, IR alignment can be employed. After alignment and development, the side portions 34 of the wafer structure 30 can be removed, preferably by DRIE plasma etching. As an alternative method, a single plasma etch could be employed before or after bonding of the wafer structure 30 to the substrate 36, and tabs or thick scribe street rims could be employed to mechanically reinforce the wafer structure 30 after etching prior to bonding.

With the microtube 50 cantilevered over the recess 44 in the substrate 36 as represented in FIG. 9, the microtube 50 can be vibrated and its movement induced relative to the substrate 36 in a direction perpendicular to the plane of the microtube 50. For this purpose, FIGS. 7, 8 and 9 show drive and sensor electrodes 52 and 54 formed within the recess 44 for electrostatic coupling with the microtube 50. The conductive layer 40 on the lower surface of the microtube 50 facing the electrodes 52 and 54 can serve as an electrode on the microtube 50 for electrostatically driving the freestanding portion of the microtube 50 with the drive electrode 52. Alternatively, the microtube 50 could be formed to be electrically conductive, such as doped silicon, to enable electrostatic driving of the microtube 50 without a separate electrode. It should be noted that vibration or other desired movement of the microtube 50 relative to the substrate 36 can be induced in the tube 50 by means other than electrostatically, including but not limited to piezoelectrically, piezoresistively, acoustically, ultrasonically, magnetically, optically, or another actuation technique. Movement of the tube 50 can be sensed capacitively, piezoelectrically, piezoresistively, acoustically, ultrasonically, magnetically, optically, or another sensing technique. These actuation and sensing techniques can be applied to the microtube 50 in combination with the substrate 36, or without the presence of the substrate 36, or in combination with another substrate such as a product package.

In addition to the U-shape represented in the Figures, the microtube 50 and its passage 32 can have a variety of other shapes (in plan view), including but not limited to the C-shaped tubes of U.S. patent application Ser. Nos. 11/620,908, 12/267,263 and 12/369,118, double tubes of U.S. patent application Ser. Nos. 12/143,942 and 12/267,263, S-shaped tubes of U.S. patent application Ser. Nos. 11/620,411 and 12/267,263, and straight tubes of U.S. patent application Ser. No. 12/369,510. The contents of these applications relating to the configurations and use of their microtubes are incorporated herein by reference. Notably, such configurations for the microtube 50 do not necessarily require the presence of the substrate 36. For example, using straight tubes of the type disclosed in U.S. patent application Ser. No. 12/369,510, the microtube 50 can be vibrated and its vibration sensed within the plane containing the microtube 50.

Figure 10:
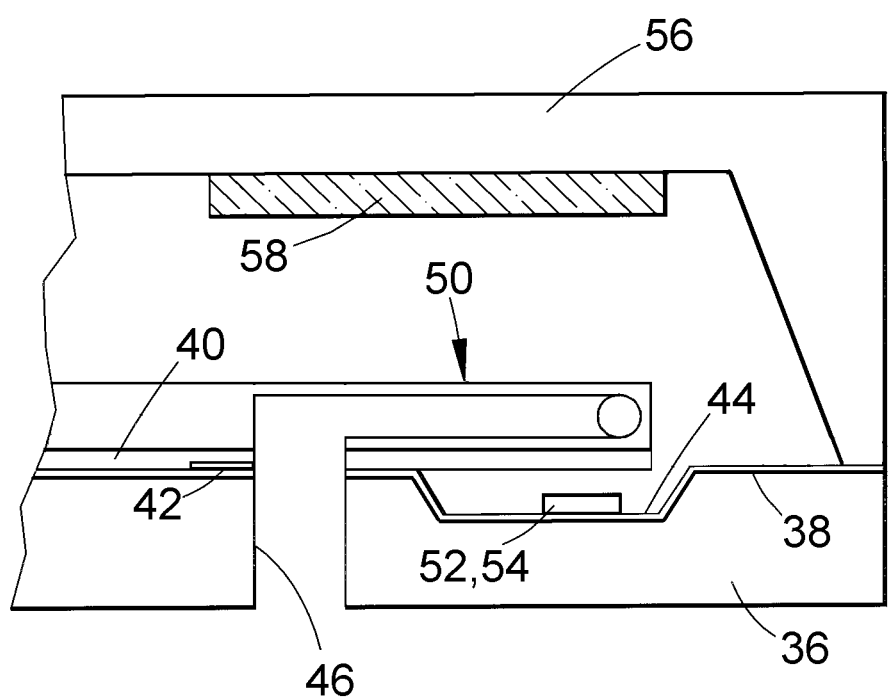
FIG. 10 depicts the result of bonding a capping wafer to the substrate to enclose the microtube.

Finally, FIG. 10 shows the result of bonding a capping wafer 56 to the substrate 36 to enclose the microtube 50, preferably vacuum sealing the microtube 50 between the substrate 36 and capping wafer 56 in order to enhance the dynamic performance of the microtube 50 if the microtube 50 is desired to vibrate, for example, in accordance with U.S. Pat. Nos. 6,477,901, 6,647,778, 7,351,603 and 7,381,628. A variety of materials can be considered for the capping wafer 56, including but not limited to silicon, glass, ceramic, and plastic wafers that can be processed to have a sufficiently deep cavity sufficient to accommodate the microtube 50. The capping wafer 56 is shown as having an integrated getter 58 to improve vacuum quality in accordance with known practices. Depending on the materials of the substrate 36 and capping wafer 56, sealing of the capping wafer 56 to the substrate 36 can be by glass frit sealing, eutectic bonding, solder bonding, anodic bonding, or other bonding technique known in the art. Alternatively, this step can be omitted if an acceptable vacuum can be formed without wafer-to-wafer bonding. In addition, the capping wafer 56 can be omitted and enclosure of the microtube 50 can be performed in a subsequent packaging step, such as but not limited to IC packaging (e.g., an IC package with a Kovar lid) or product packaging.

While the invention has been described in terms of a particular embodiment, it is apparent that other forms could be adopted by one skilled in the art. Therefore, the scope of the invention is to be limited only by the following claims.

The invention claimed is:

1. A process of fabricating a microtube of a microfluidic device, the process comprising the steps of:
    providing a first substrate;
    isotropically etching a first surface of the first substrate to define therein a channel having an arcuate cross-sectional profile;
    isotopically etching a first surface of a second substrate to define therein a channel having an arcuate cross-sectional profile;
    forming a substrate structure by bonding the first surface of the first substrate to the first surface of the second substrate so that the channels thereof are enclosed between the first and second substrates to define a passage having a cross-sectional profile defined by each of the channels of the first and second substrates;
    thinning the substrate structure by etching a second surface of the first substrate opposite the first surface thereof and by etching a second surface of the second substrate opposite the first surface thereof to define side portions of the substrate structure that are separated by the passage;
    bonding the side portions of the substrate structure to a third substrate such that a portion of the substrate structure containing the passage is spaced apart from a surface of the third substrate; and then
    removing the side portions of the substrate structure so that the portion of the substrate structure defines a microtube that projects over the surface of the third substrate and has external walls surrounding the passage, the removing step simultaneously releasing the microtube so as to be capable of movement relative to the surface of the third substrate.

2. The process according to claim 1, wherein the arcuate cross-sectional profiles of the channels are substantially identical.

3. The process according to claim 2, wherein the passage has a circular cross-sectional shape.

4. The process according to claim 2, wherein the passage has an elliptical cross-sectional shape.

5. The process according to claim 1, wherein the first and second substrates are formed of materials chosen from the group consisting of silicon, Ge, SiC, GaAs, Si/Ge, diamond, sapphire, glass, ceramic materials, plastic materials, and metallic materials.

6. The process according to claim 1, wherein the first substrate comprises a buried layer, and the step of thinning the substrate structure comprises using the buried layer as an etch stop.

7. The process according to claim 1, wherein the third substrate comprises at least one of a semiconductor, silicon, glass, ceramic, or plastic material.

8. The process according to claim 1, wherein the third substrate comprises a semiconductor material and an insulating layer to which the substrate structure is bonded.

9. The process according to claim 8, further comprising means on the substrate structure and the third substrate for electrically connecting the microtube to metallization on the third substrate.

10. The process according to claim 1, further comprising enclosing the microtube by bonding a capping wafer to the third substrate.

11. The process according to claim 10, further comprising vacuum sealing the microtube within a cavity defined by and between the third substrate and the capping wafer.

12. The process according to claim 1, further comprising forming holes in the third substrate that fluidically interconnect with opposite ends of the passage of the microtube and define fluid inlet and outlet ports of the microtube.

13. The process according to claim 1, further comprising vibrating the microtube and sensing movement of the microtube relative to the third substrate.

14. The process according to claim 13, wherein the microtube is vibrated perpendicular to a plane containing the microtube.

15. The process according to claim 1, further comprising vibrating the microtube within a plane containing the microtube.

* * * * *